(12) United States Patent
Anderson et al.

(10) Patent No.: US 10,224,249 B2
(45) Date of Patent: Mar. 5, 2019

(54) MERGED GATE FOR VERTICAL TRANSISTORS

(71) Applicant: International Business Machines Corporation, Armonk, NY (US)

(72) Inventors: Brent A. Anderson, Jericho, VT (US); Fee Li Lie, Albany, NY (US); Edward J. Nowak, Shelburne, VT (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/474,564

(22) Filed: Mar. 30, 2017

(65) Prior Publication Data
US 2018/0005902 A1   Jan. 4, 2018

Related U.S. Application Data

(62) Division of application No. 15/198,603, filed on Jun. 30, 2016, now Pat. No. 9,755,071.

(51) Int. Cl.
*H01L 29/78* (2006.01)
*H01L 29/66* (2006.01)
*H01L 21/32* (2006.01)
*H01L 21/82* (2006.01)
*H01L 27/08* (2006.01)
(Continued)

(52) U.S. Cl.
CPC ........... *H01L 21/823828* (2013.01); *H01L 21/28132* (2013.01); *H01L 21/32139* (2013.01); *H01L 21/823885* (2013.01); *H01L 27/092* (2013.01); *H01L 29/0649* (2013.01); *H01L 29/42392* (2013.01); *H01L 29/6653* (2013.01); *H01L 29/66666* (2013.01); *H01L 29/7827* (2013.01);
(Continued)

(58) Field of Classification Search
CPC .......... H01L 29/7827; H01L 21/32139; H01L 21/823437; H01L 21/823487; H01L 21/823828; H01L 21/823885; H01L 27/088; H01L 27/092; H01L 29/0649; H01L 29/6653; H01L 29/66666; H01L 29/42392; H01L 21/28132
USPC ........................................... 257/329; 438/212
See application file for complete search history.

(56) References Cited

U.S. PATENT DOCUMENTS 6,800,885 B1 * 10/2004 An ..................... H01L 29/42392
257/192

OTHER PUBLICATIONS

Anderson et al., "Merged Gate for Vertical Transistors," U.S. Appl. No. 15/198,603, filed Jun. 30, 2016.
(Continued)

*Primary Examiner* — Didarul Mazumder
(74) *Attorney, Agent, or Firm* — Cantor Colburn LLP; Vazken Alexanian

(57) ABSTRACT

Embodiments of the invention are directed to a semiconductor structure that includes a first fin structure having a first sidewall, a first gate structure adjacent a lower portion of the first sidewall, and a first spacer structure over the first gate structure and adjacent an upper portion of first the sidewall. The first spacer structure includes a first spacer structure thickness dimension that extends in a first direction away from the first sidewall. The first gate structure includes a first gate structure thickness dimension that extends in the first direction away from the first sidewall. The first gate structure dimension is about equal to the first spacer structure thickness dimension.

19 Claims, 13 Drawing Sheets

(51) Int. Cl.
- *H01L 29/06* (2006.01)
- *H01L 27/092* (2006.01)
- *H01L 21/28* (2006.01)
- *H01L 29/423* (2006.01)
- *H01L 21/8238* (2006.01)
- *H01L 21/3213* (2006.01)
- *H01L 21/8234* (2006.01)
- *H01L 27/088* (2006.01)

(52) U.S. Cl.
CPC ........... *H01L 21/823437* (2013.01); *H01L 21/823487* (2013.01); *H01L 27/088* (2013.01)

(56) References Cited

OTHER PUBLICATIONS

List of IBM Patents or Patent Applications Treated As Related; Date Filed: Mar. 30, 2017, 2 pages.

\* cited by examiner

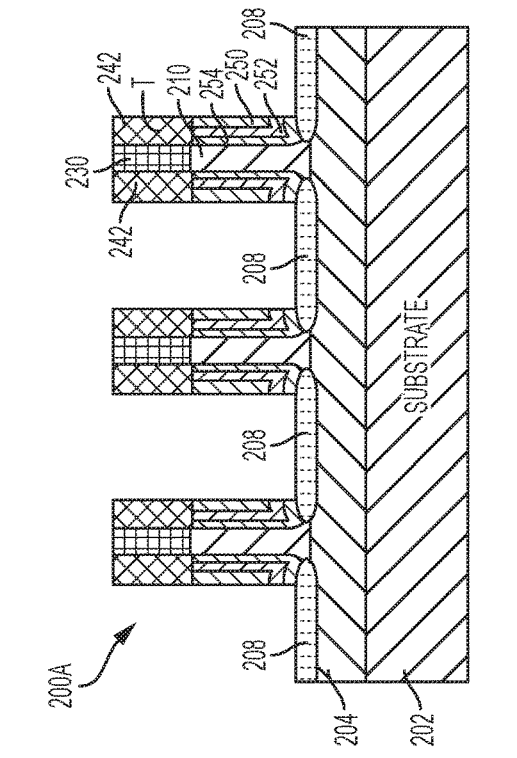
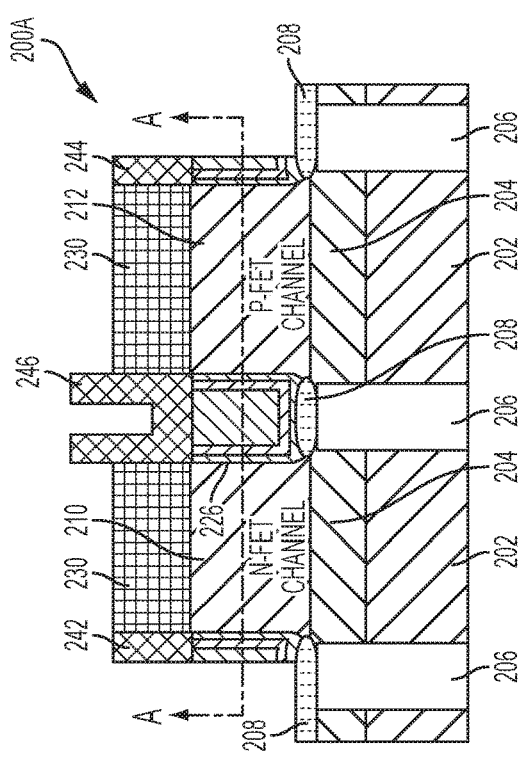
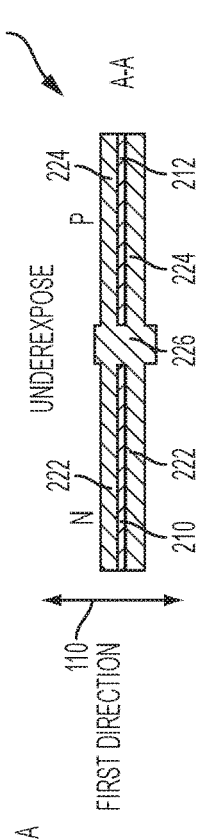
FIG. 2A
FIG. 2B
FIG. 2C
FIG. 2D

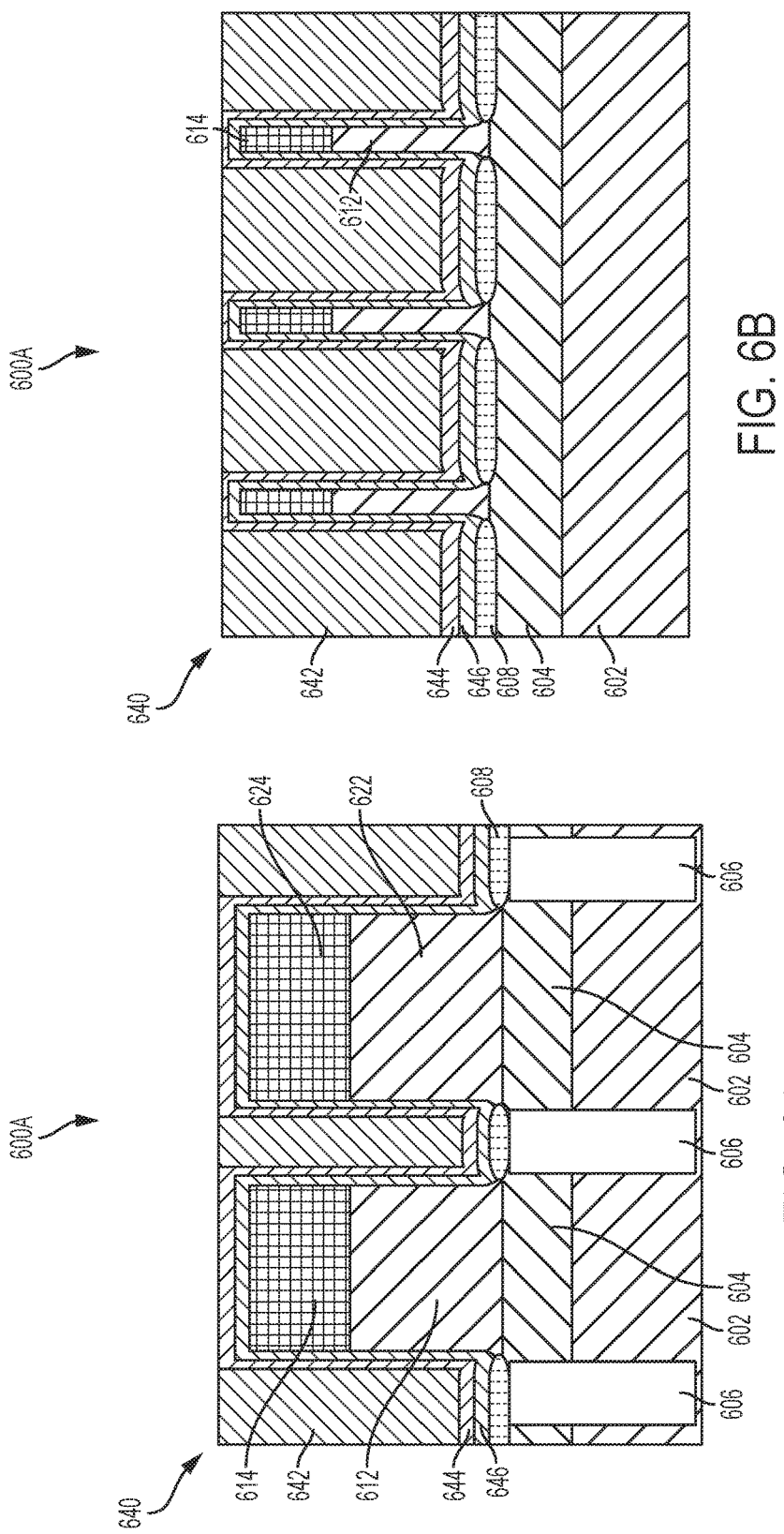

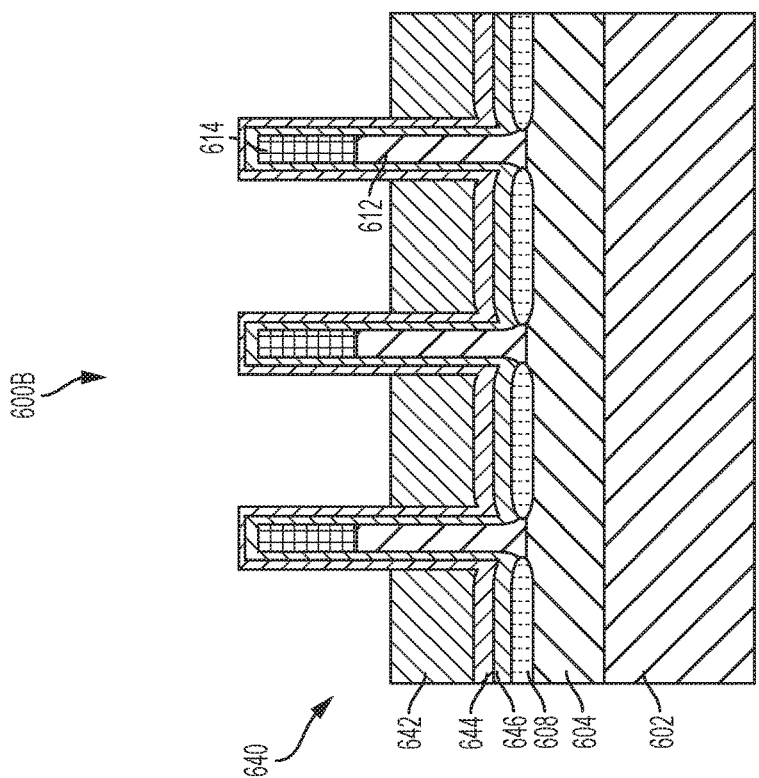
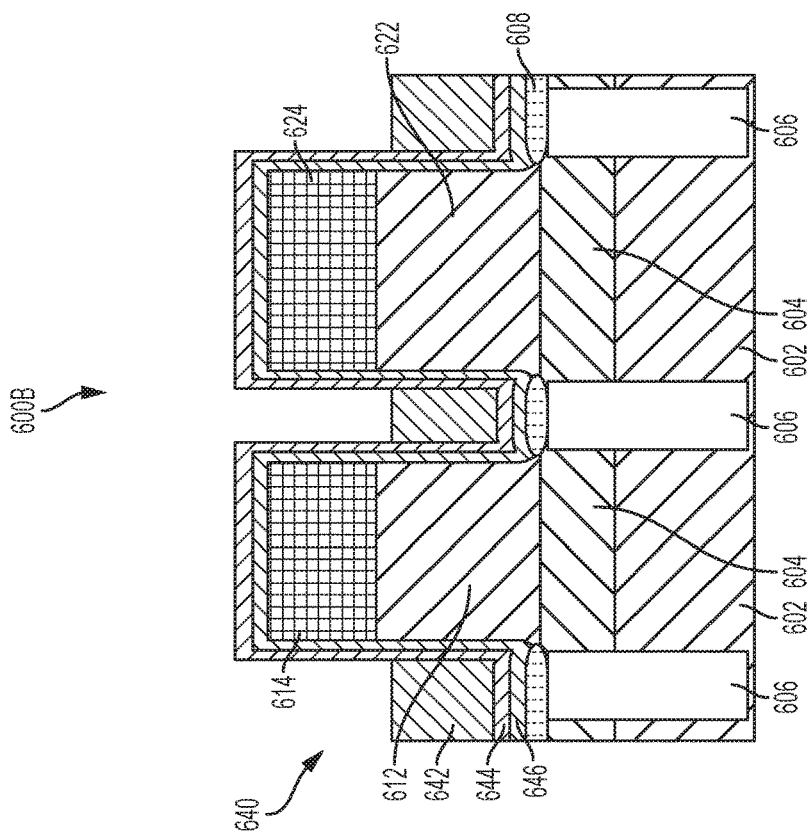
FIG. 7A
FIG. 7B

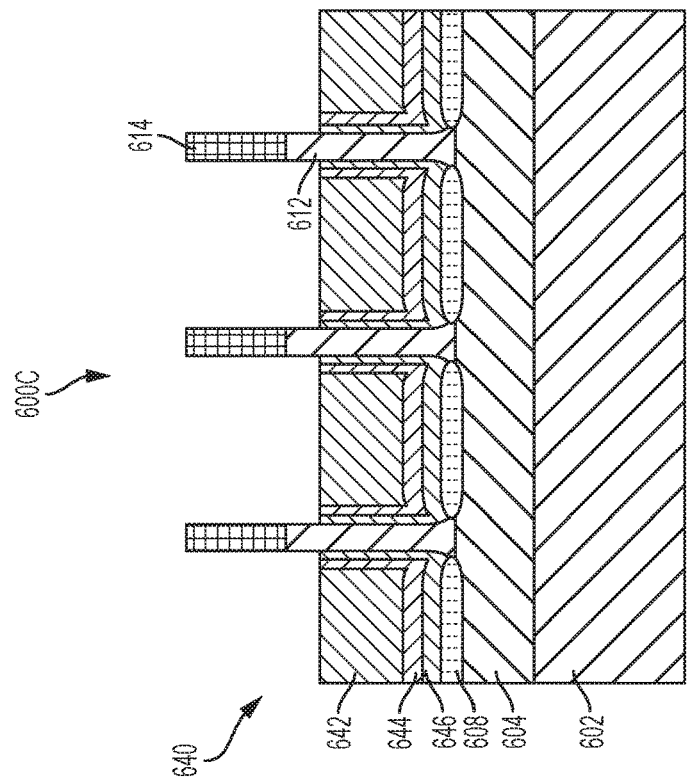
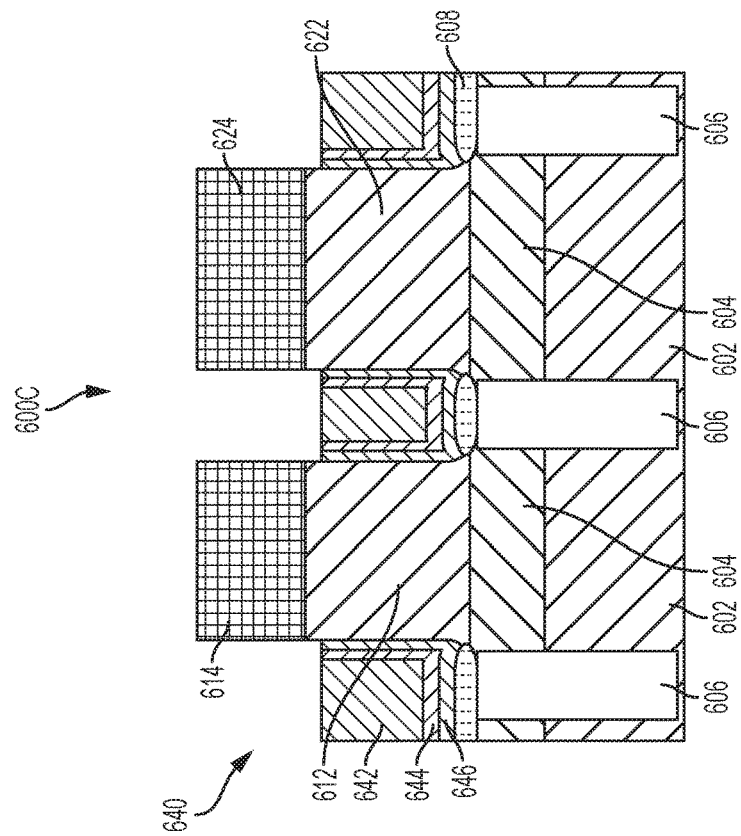

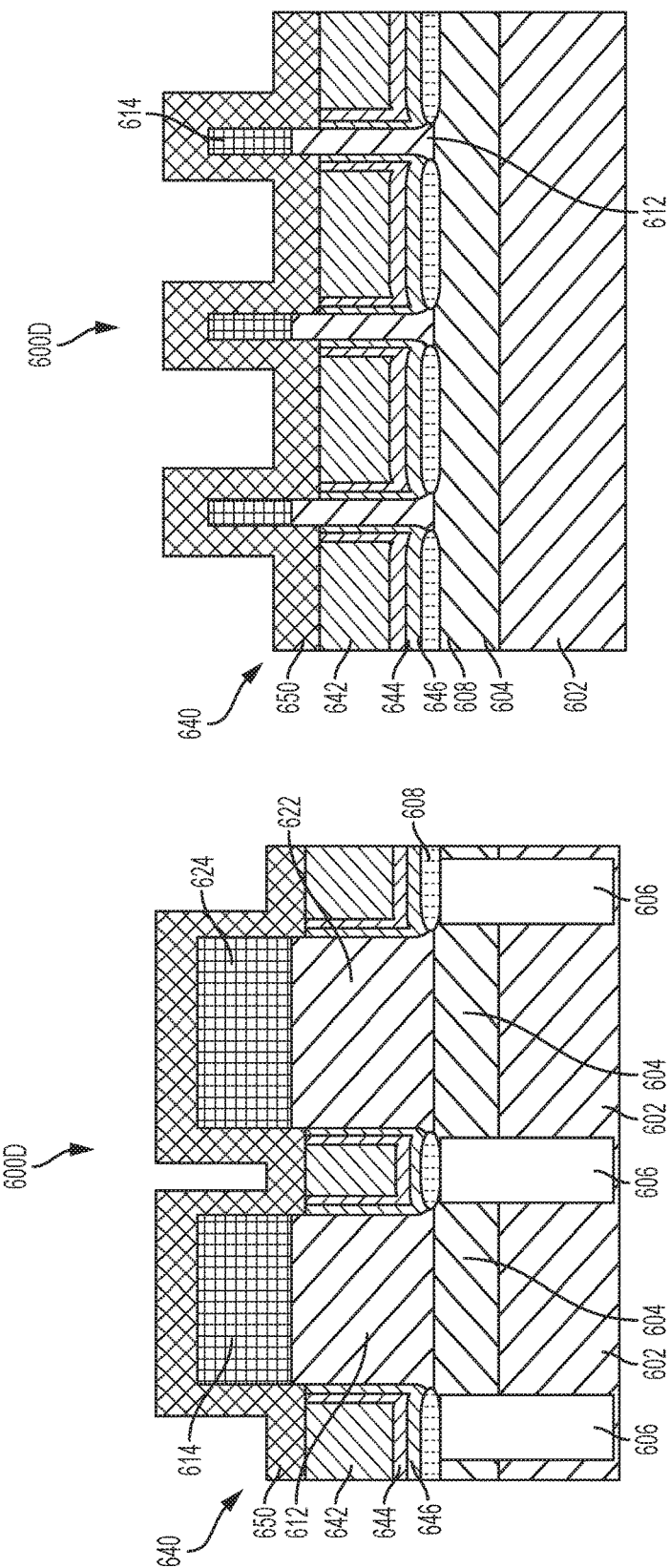

MERGED GATE FOR VERTICAL TRANSISTORS

DOMESTIC PRIORITY

This application is a divisional of U.S. application Ser. No. 15/198,603, titled "MERGED GATE FOR VERTICAL TRANSISTORS" filed Jun. 30, 2016, the contents of which are incorporated by reference herein in its entirety.

BACKGROUND

The present invention relates in general to forming transistors in integrated circuits (ICs). More specifically, the present invention relates to improved systems, fabrication methodologies and resulting structures for vertical field effect transistors (FETs) that include relatively high aspect ratio structures, are self-aligned, have merged gates and include sufficient area for placement of a merged gate contact.

Semiconductor devices are typically formed using active regions of a wafer. In an IC having a plurality of metal oxide semiconductor field effect transistors (MOSFETs), each MOSFET has a source and a drain that are formed in an active region of a semiconductor layer by implanting n-type or p-type impurities in the layer of semiconductor material.

One type of MOSFET is a non-planar FET known generally as a vertical FET. In order to decrease gate pitch (i.e., the center-to-center distance between adjacent gate structures) and increase device density on the wafer, the aspect ratios of the channel region and the gate region of a typical vertical FET device are high. In other words, the channel and gate regions are each much taller than they are wide. However, overlay errors in known lithography fabrication techniques impose lower limits on gate thickness, thereby making it a challenge to fabricate vertical FET structures having the desired high aspect ratios.

SUMMARY

Embodiments of the invention are directed to a semiconductor structure that includes a first fin structure having a first sidewall, a first gate structure adjacent a lower portion of the first sidewall, and a first spacer structure over the first gate structure and adjacent an upper portion of first the sidewall. The first spacer structure includes a first spacer structure thickness dimension that extends in a first direction away from the first sidewall. The first gate structure includes a first gate structure thickness dimension that extends in the first direction away from the first sidewall. The first gate structure dimension is about equal to the first spacer structure thickness dimension.

Embodiments of the invention are directed to a semiconductor structure that includes a first fin structure having a first sidewall, a first gate structure adjacent a lower portion of the first sidewall, a second fin structure having a second sidewall, and a second gate structure having a merged gate region that couples the first gate structure and the second gate structure. A top surface of the initial merged gate structure is below a top surface of the first fin structure and a top surface of the second fin structure.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIG. 2A depicts a cross-sectional view of a semiconductor structure having a merged gate according to one or more embodiments;

FIG. 2B depicts a cross-sectional view of a semiconductor structure having a merged gate according to one or more embodiments, wherein the view shown in FIG. 2B has been rotated 90 degrees counterclockwise from the view shown in FIG. 2A;

FIG. 2C depicts a cross-sectional view of the semiconductor structure shown in FIG. 2A taken along section A-A;

FIG. 2D depicts another cross-sectional view of the semiconductor structure shown in FIG. 2A taken along section A-A;

FIG. 6A depicts a cross-sectional view of a semiconductor structure after a fabrication stage according to one or more embodiments;

FIG. 6B depicts a cross-sectional view of a semiconductor structure after a fabrication stage according to one or more embodiments, wherein the view shown in FIG. 6B has been rotated 90 degrees counterclockwise from the view shown in FIG. 6A;

FIG. 7A depicts a cross-sectional view of a semiconductor structure after a fabrication stage according to one or more embodiments;

FIG. 7B depicts a cross-sectional view of a semiconductor structure after a fabrication stage according to one or more embodiments, wherein the view shown in FIG. 7B has been rotated 90 degrees counterclockwise from the view shown in FIG. 7A;

FIG. 8A depicts a cross-sectional view of a semiconductor structure after a fabrication stage according to one or more embodiments;

FIG. 8B depicts a cross-sectional view of a semiconductor structure after a fabrication stage according to one or more embodiments, wherein the view shown in FIG. 8B has been rotated 90 degrees counterclockwise from the view shown in FIG. 8A;

FIG. 9A depicts a cross-sectional view of a semiconductor structure after a fabrication stage according to one or more embodiments;

FIG. 9B depicts a cross-sectional view of a semiconductor structure after a fabrication stage according to one or more embodiments, wherein the view shown in FIG. 9B has been rotated 90 degrees counterclockwise from the view shown in FIG. 9A;

Figure 1:
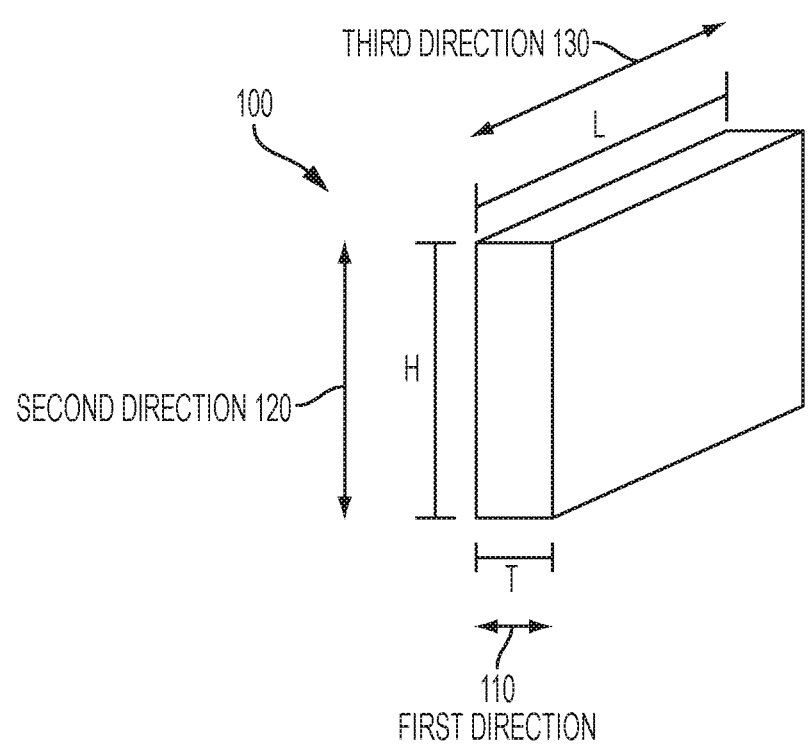
FIG. 1 depicts a three-dimensional view of a high aspect ratio structure and various dimensions and directions that are used to describe aspects of one or more embodiments.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of vertical FET, implementation of the teachings recited herein are not limited to a particular type of vertical FET or IC architecture. Rather embodiments of the present invention are capable of being implemented in conjunction with any other type of vertical FET or IC architecture, now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

Semiconductor devices are used in a variety of electronic and electro-optical applications. ICs are typically formed from various circuit configurations of discrete components (e.g., transistors, capacitors, resistors, semiconductor devices, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the following immediately following paragraphs.

The semiconductor device structures of the present invention can be fabricated in a number of ways using a number of different tools. In general, though, the methodologies and tools are used to form structures with dimensions in the micrometer and nanometer scale. The methodologies, i.e., technologies, employed to fabricate the semiconductor device structures of the present invention have been adopted from IC technology. For example, semiconductor device structures are built on wafers and are realized in films of material patterned by photolithographic processes on the top of a wafer. In particular, the fabrication of semiconductor device structures uses four basic building blocks: (i) deposition of thin films of material on a substrate, (ii) applying a patterned mask on top of the films by photolithographic imaging, (iii) semiconductor doping, and/or (iv) etching the films selectively to the mask.

In general, deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Semiconductor devices are typically formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Various alternative MOSFET device structures have been proposed to improve device performance, particularly at the interface between the gate and the channel. One type of MOSFET is a non-planar device known generally as a fin-type field effect transistor (FinFET). The basic electrical layout and mode of operation of a FinFET device does not differ significantly from a traditional field effect transistor (FET). In contrast to a planar MOSFET, however, the source, drain and channel regions of a FinFET are built as a three-dimensional fin/bar on top of a local shallow trench isolation (STI) region and a semiconductor substrate. The gate electrode is wrapped over the top and sides of a middle portion of the fin such that the grate electrode is substantially perpendicular with respect to the fin. This middle portion of the fin, which is under the gate electrode, functions as the channel and provides an increased effective channel width compared to planar MOSFETs. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

As non-planar MOSFETs are scaled to smaller dimensions/geometries for higher device density, so-called vertical FETs have been developed. One type of vertical FET is known generally as a nanowire vertical FET. Unlike FinFET structures, the entire fin of a nanowire vertical FET functions as the channel region. The gate, which is parallel to the vertical sidewalls of the fin, wraps around the fin sidewalls. Source/drain regions are formed above and below the fin channel.

In order to decrease gate pitch (i.e., the center-to-center distance between adjacent gate structures) and increase device density of a typical vertical FET, it is desirable to form the fin/channel region and the surrounding gate region with relatively high aspect ratios. In other words, it is desirable for the fin/channel region and the gate region to each be much taller than wide. However, overlay errors in traditional lithography techniques add significantly to gate thickness, thereby making it a challenge to fabricate vertical FET structures having relatively high aspect ratios for the fin/channel and/or the gate.

Embodiments of the present invention provides improved fabrication methodologies and resulting structures for vertical FETs that include relatively high aspect ratio structures, are self-aligned, have merged gates and include sufficient area for placement of a merged gate contact. According to one or more embodiments, a self-aligned sidewall image transfer (SIT) technique is used to form the parallel gate of a vertical FET, thereby mitigating overlay errors and providing thin, high aspect ratio gates for maximum device density on the wafer. The described SIT technique is also used to form adjacent gate structures that are merged.

According to one or more embodiments, during an initial SIT fabrication operation, a relatively thick initial merged gate structure is formed. The initial merged gate structure includes adjacent gate structures joined by a merged gate region. The initial gate structure is etched using a novel sidewall image transfer (SIT) process to reduce the initial gate structure to the desired gate thickness. However, because the post-etch adjacent gates will be thin high aspect ratio structures, the SIT etch process that forms the thin gate structures has the potential to also etch the merged gate region that joins the adjacent gate structures. In order to ensure that the initial merged gate region remains intact during gate fabrication (i.e., during the gate etch), a protective structure is formed over the merged gate region prior to the SIT gate etch operation. The protective structure ensures that the merged gate region is not etched away during the gate etch operation. Without the described protective structure taught by the present invention, the SIT gate etch operation would etch away the merged gate region, and the adjacent thin high aspect ratio gate regions would not be merged. The footprint of the protective structure on the wafer defines the footprint of the merged gate region. The footprint of the protective structure is chosen to ensure that the footprint of the merged gate region includes sufficient area for making electrical contact to the resulting merged gate region.

Turning now to a more detailed description of the present invention, FIG. 1 depicts a three-dimensional view of a high aspect ratio structure 100 and various dimensions and directions that are used herein as reference points to describe aspects of one or more embodiments of the present invention. Structure 100 can be any high aspect ratio structure of a semiconductor device, including, for example, a vertical gate or a vertical fin that will become the gate/channel regions of a vertical FET. Structure 100 includes a thickness dimension T extending along a first direction 110, a height dimension H extending along a second direction 120, and a length dimension L extending along a third direction 130. In general, first direction 110 is substantially perpendicular to second direction 120 and third direction 130, and second direction 120 is substantially perpendicular to third direction 130. Structure 100 has a high aspect ratio because, as shown, its height dimension H is greater than its thickness dimension T.

FIGS. 2A-2D depict different views of semiconductor structures having a merged gate fabricated according to sidewall image transfer and merged gate formation processes of the present invention. More specifically, FIG. 2A depicts a cross-sectional view of a semiconductor structure 200A having a merged gate according to one or more embodiments. FIG. 2B depicts another cross-sectional view of semiconductor structure 200A, wherein the view shown in FIG. 2B has been rotated 90 degrees counterclockwise from the view shown in FIG. 2A. FIG. 2C depicts a cross-sectional view of semiconductor structure 200A shown in FIG. 2A taken along section A-A, wherein the merged gate region 226 has been underexposed (i.e., made larger). FIG. 2D depicts another cross-sectional view of semiconductor structure 200A shown in FIG. 2A taken along section A-A, wherein the merged gate region 226 has been overexposed (i.e., made smaller).

Semiconductor structure 200A has been fabricated up to the formation of its merged gate structure. Subsequent fabrication processes (e.g., formation of upper spacer, top source/drain regions, gate contacts, etc.) are applied to structure 200A to form a finished semiconductor device, which, according to one or more embodiments, is a vertical FET device. The details of suitable subsequent fabrication processes to form a finished semiconductor device, including specifically forming a finished vertical FET, are known to those skilled in the art so have been omitted in the interest of brevity.

As best shown in FIGS. 2A and 2D, semiconductor structure 200A includes a substrate 202, source/drain (S/D) regions 204, shallow trench isolation (STI) regions 206 to isolate separate devices, bottom spacers 208, fins 210, 212, a merged gate formed from a first gate structure 222 and a second gate structure 224 joined by a merged gate region 226, hard masks 230 and a sidewall image transfer (SIT) spacer formed from a first spacer structure 242 and a second spacer structure 244 joined by a merged spacer region 246, configured and arranged as shown. In the final semiconductor device (not shown), fin 210 will form the channel region of an n-type vertical FET (not shown), and fin 212 will form the channel region of a p-type vertical FET (not shown). As best shown in FIGS. 2C and 2D, merged gate includes a first gate structure 222 and a second gate structure 224 joined by a merged gate region 226. Merged gate 220 wraps around fin 210 and fin 212. As best shown in FIGS. 2A and 2B, SIT spacer includes a first spacer structure 242 and a second spacer structure 244 joined by a merged spacer region 246. The SIT spacer structures sit over merged gate structure 220, and wrap around upper portions (e.g., hardmasks 230) of fin 210 and fin 212.

As best shown in FIG. 2B, the thickness dimension T of first SIT spacer 242 or second SIT spacer 244 defines the thickness dimension of first gate 222 and/or second gate structure 224. As best shown in FIG. 2A, the area of a bottom surface of merged spacer region 246 defines the area of a top surface of merged gate region 226. As best shown in FIG. 2B, the gate can be a gate stack formed from a low-resistance metal 250 formed over a work function metal 252 and a high-k layer 254.

Figure 3:
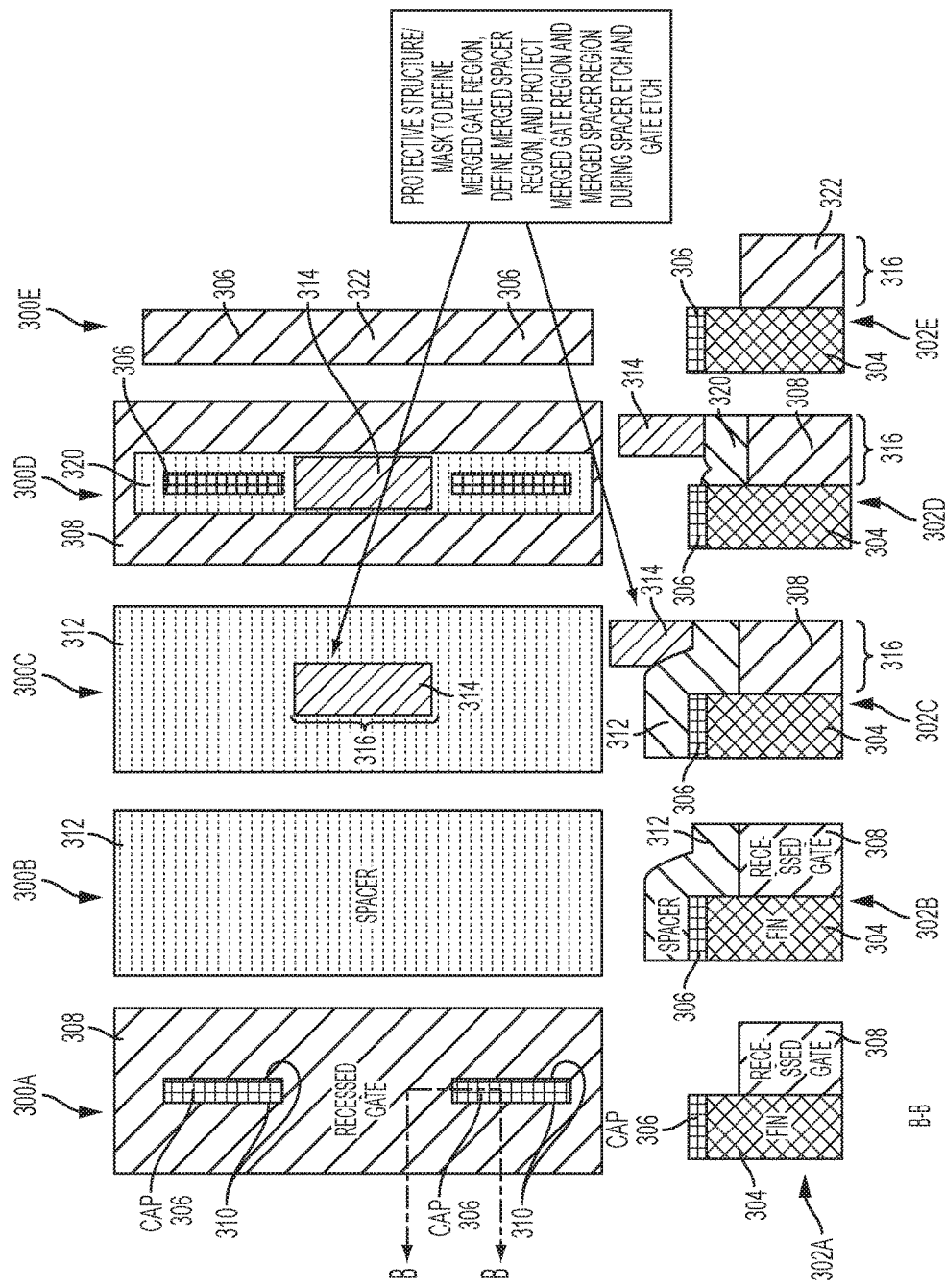
FIG. 3 depicts a diagram of semiconductor structures after various fabrication stages according to one or more embodiments.
Figure 4:
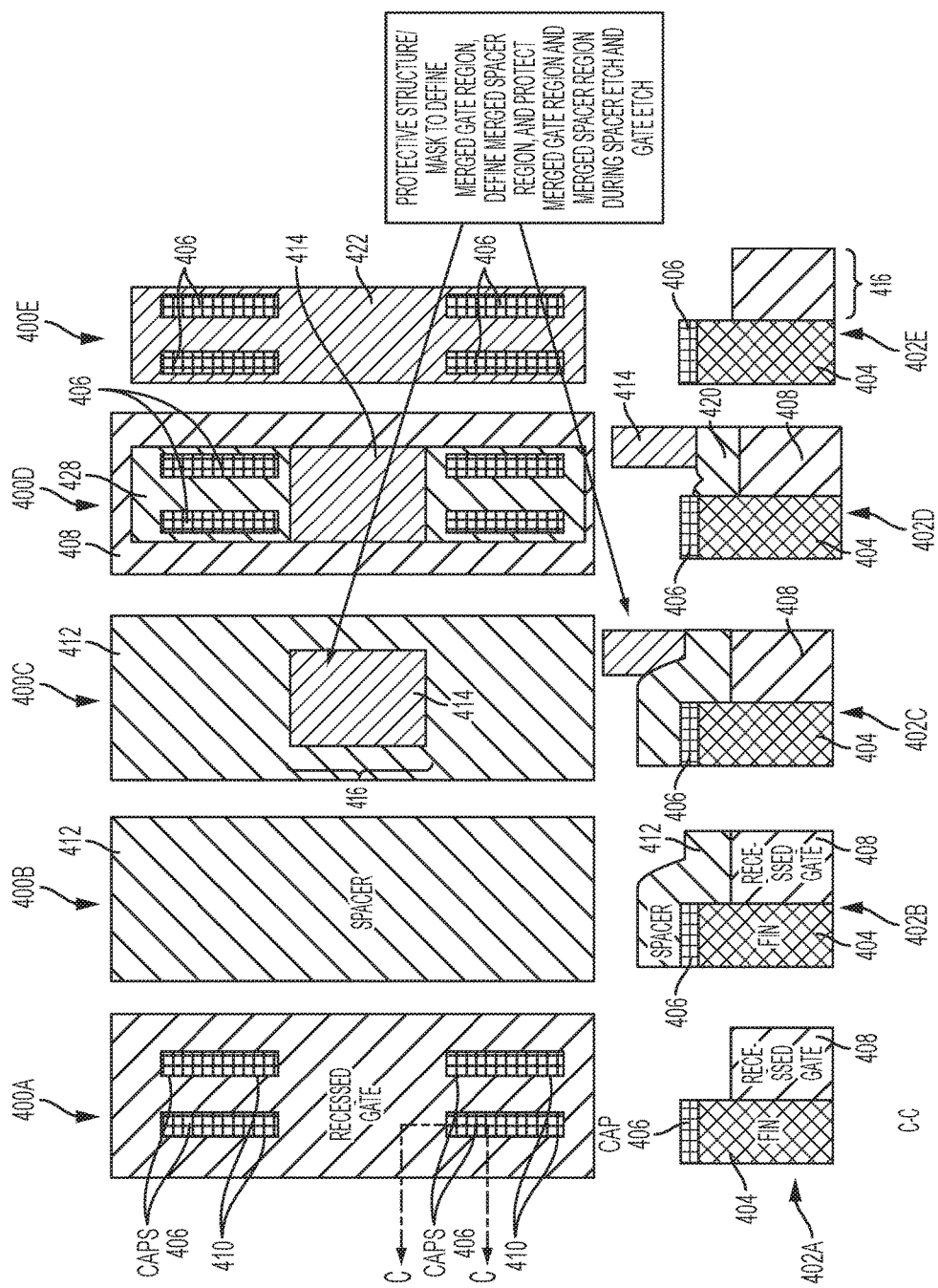
FIG. 4 depicts another diagram of semiconductor structures after various fabrication stages according to one or more embodiments.
Figure 5:
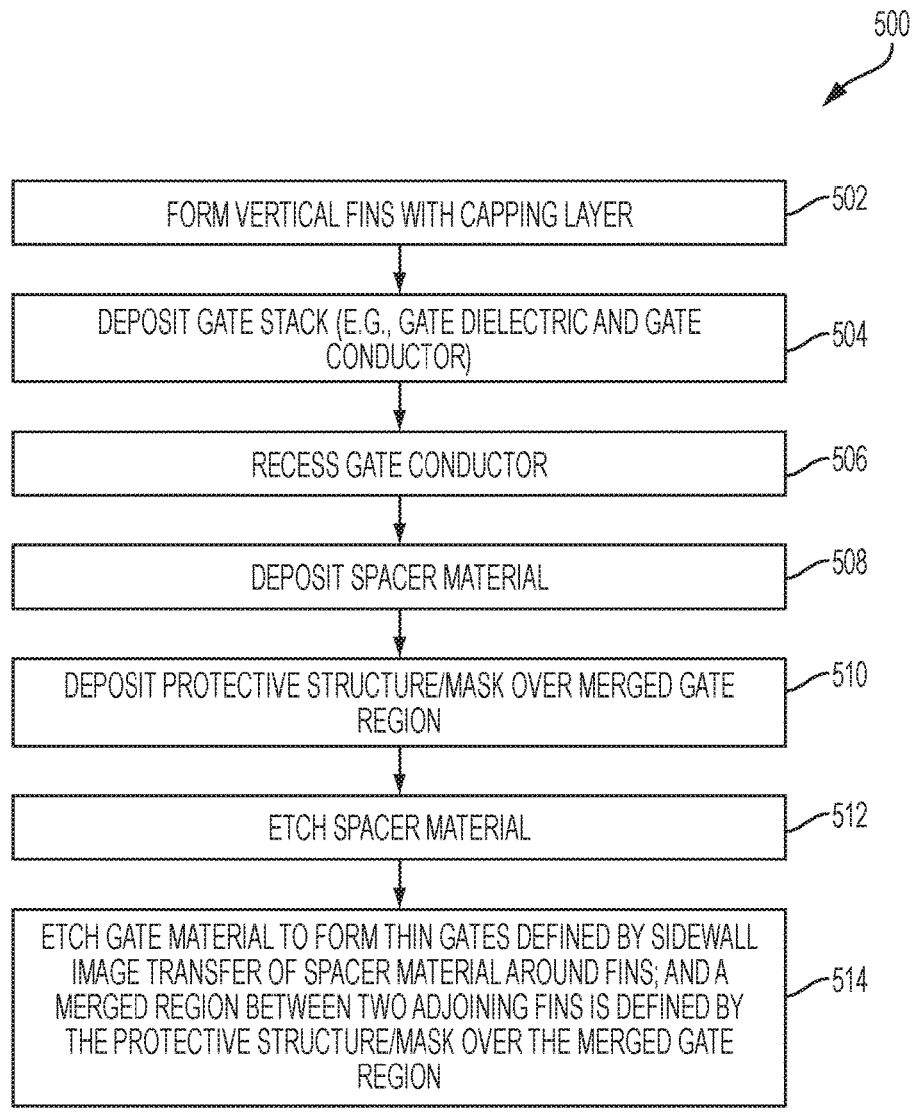
FIG. 5 depicts a flow diagram illustrating a methodology according to one or more embodiments.

A method of fabricating structure 200A according to one or more embodiments of the present invention will now be descried with reference to FIGS. 3, 4 and 5. More specifically, FIG. 3 depicts a diagram of semiconductor structures after various fabrication stages according to one or more embodiments. FIG. 4 depicts another diagram of semiconductor structures after various fabrication stages according to one or more embodiments, and FIG. 5 depicts a flow diagram illustrating a methodology 500 according to one or more embodiments. A description of SIT/merged gate fabrication methodologies according to one or more embodiment of the present invention will now be provided with reference to the gate fabrication stages shown in FIGS. 3 and 4, as well as methodology 500 shown in FIG. 5.

As shown in FIG. 3, structures 300A, 300B, 300C, 300D, 300E depict top views of the structures after fabrication operations. Structures 302A, 302B, 302C, 302D, 302E are shown immediately below corresponding top view structures 300A, 300B, 300C, 300D, 300E. Structures 302A, 302B, 302C, 302D, 302E depict cross-sectional views of each of the top view structures taken along line B-B. Structures 302A, 302B, 302C, 302D, 302E provide a closer view of how the merged gate is preserved during the described SIT process according to embodiments of the present invention. As shown by structures 300A, 302A, vertical fins 304 having capping layers 306 are formed (block 502). An initial gate structure 308 is formed adjacent sidewalls 310 of fins 304, and then recessed (blocks 504, 506). The initial gate structure 308 can be a gate stack formed from a gate dielectric and a gate conductor. The fin sidewalls 310 extend completely around fins 304. As shown by structures 300B, 302B, an initial spacer structure material 312 is conformally deposited over fin cap 306, fin sidewalls 310 and the recessed gate, which is the initial gate structure 308 (block 508).

As shown by structures 300C, 302C, a protective structure 314 is deposited over a portion of initial spacer structure 312 (block 510). Protective structure 314 defines the area that will become the merged gate region 316, which generally includes all structures below protective structure 314. As shown by structures 300D, 302D, initial spacer structure 312 is etched to form the SIT gate structure 320 (block 512). In one or more embodiments, a timed directional etch is applied to initial spacer structure 312. Because initial gate structure 312 was conformally formed over fin cap 306, fin sidewalls 310 and initial gate structure 308, and because the directional etch is applied for a certain time duration, the portions of initial spacer structure 312 over fin cap 306 and initial gate structure 308 etch first, and the etch is stopped before the spacer material on fin sidewalls 310 is etched. In addition, during the direction etch, protective structure 314 protects merged gate region 316. Accordingly, after the directional etch, SIT spacer and merged spacer structure 320 is formed. As shown by structures 300E, 302E, initial gate structure 308 is etched, and the footprint of SIT spacer and merged spacer structure 320 (and protective mask structure 314) is transferred to initial gate structure 308 to form merged gate structure 322 according to embodiments of the present invention (block 514). Although the described SIT operation and merged gate formation operations are described together, it is not essential that they are performed together, and it is contemplated that the described SIT technique can be performed separately from a merged gate formation.

The protective structure 314 ensures that the merged gate region 316 is not etched away during the gate etch operation. Without the described protective structure 314, the SIT gate etch operation would etch away the merged gate region 316, and the adjacent thin high aspect ratio gate regions would not be merged. A top surface area of the protected merged gate region 316, which is defined by a surface area of the protective structure 314, includes sufficient area for making electrical contact to the resulting merged gate region 316.

FIG. 4 is substantially identical to FIG. 3, except that FIG. 4 illustrates how the described SIT and merged gate fabrication processes can be applied to multiple pairs of gates. Accordingly, the merged gate region 316A shown in FIG. 4 joins two pair of fins 304A instead of one pair of fins 304. Otherwise, the methodology illustrated by FIG. 4 is the same as the methodology illustrated by FIG. 3.

A method of fabricating a multiple fin-pair variation of structure 200A according to one or more embodiments of the present invention will now be descried with reference to FIGS. 4 and 5. More specifically, a description of SIT/merged gate fabrication methodologies according to one or more embodiment of the present invention will now be provided with reference to the gate fabrication stages shown in FIG. 4, as well as methodology 500 shown in FIG. 5.

As shown in FIG. 4, structures 400A, 400B, 400C, 400D, 400E depict top views of the structures after fabrication operations. Structures 402A, 402B, 402C, 402D, 402E are shown immediately below corresponding top view structures 400A, 400B, 400C, 400D, 400E. Structures 402A, 402B, 402C, 402D, 402E depict cross-sectional views of each of the top view structures taken along line B-B. Structures 402A, 402B, 402C, 402D, 402E provide a closer view of how the merged gate is preserved during the described SIT process according to embodiments of the present invention. As shown by structures 400A, 402A, vertical fins 404 having capping layers 406 are formed (block 502). An initial gate structure 408 is formed adjacent sidewalls 410 of fins 404, and then recessed (blocks 504, 506). The initial gate structure 408 can be a gate stack formed from a gate dielectric and a gate conductor. The fin sidewalls 410 extend completely around fins 404. As shown by structures 400B, 402B, an initial spacer structure material 412 is conformally deposited over fin cap 406, fin sidewalls 410 and the recessed gate, which is the initial gate structure 408 (block 508).

As shown by structures 400C, 402C, a protective structure 414 is deposited over a portion of initial spacer structure 412 (block 510). Protective structure 414 defines the area that will become the merged gate region 416, which generally includes all structures below protective structure 414. As shown by structures 400D, 402D, initial spacer structure 412 is etched to form the SIT gate structure 420 (block 512). In one or more embodiments, a timed directional etch is applied to initial spacer structure 412. Because initial gate structure 412 was conformally formed over fin cap 406, fin sidewalls 410 and initial gate structure 408, and because the directional etch is applied for a certain time duration, the portions of initial spacer structure 412 over fin cap 406 and initial gate structure 408 etch first, and the etch is stopped before the spacer material on fin sidewalls 410 is etched. In addition, during the direction etch, protective structure 414 protects merged gate region 416. Accordingly, after the directional etch, SIT spacer and merged spacer structure 420 is formed. As shown by structures 400E, 402E, initial gate structure 408 is etched, and the footprint of SIT spacer and merged spacer structure 420 (and protective mask structure 414) is transferred to initial gate structure 408 to form merged gate structure 422 according to embodiments of the present invention (block 514). Although the described SIT operation and merged gate formation operations are described together, it is not essential that they performed together, and it is contemplated that the described SIT technique can be performed separately from a merged gate formation.

As with protective structure 314 shown in FIG. 3, protective structure 414 in FIG. 4 ensures that the merged gate region 416 is not etched away during the gate etch operation. Without the described protective structure 414, the SIT gate etch operation would etch away the merged gate region 416, and the adjacent thin high aspect ratio gate regions would not be merged. A top surface area of the protected merged gate region 416, which is defined by a surface area of the protective structure 414, includes sufficient area for making electrical contact to the resulting merged gate region 416.

Figure 11:
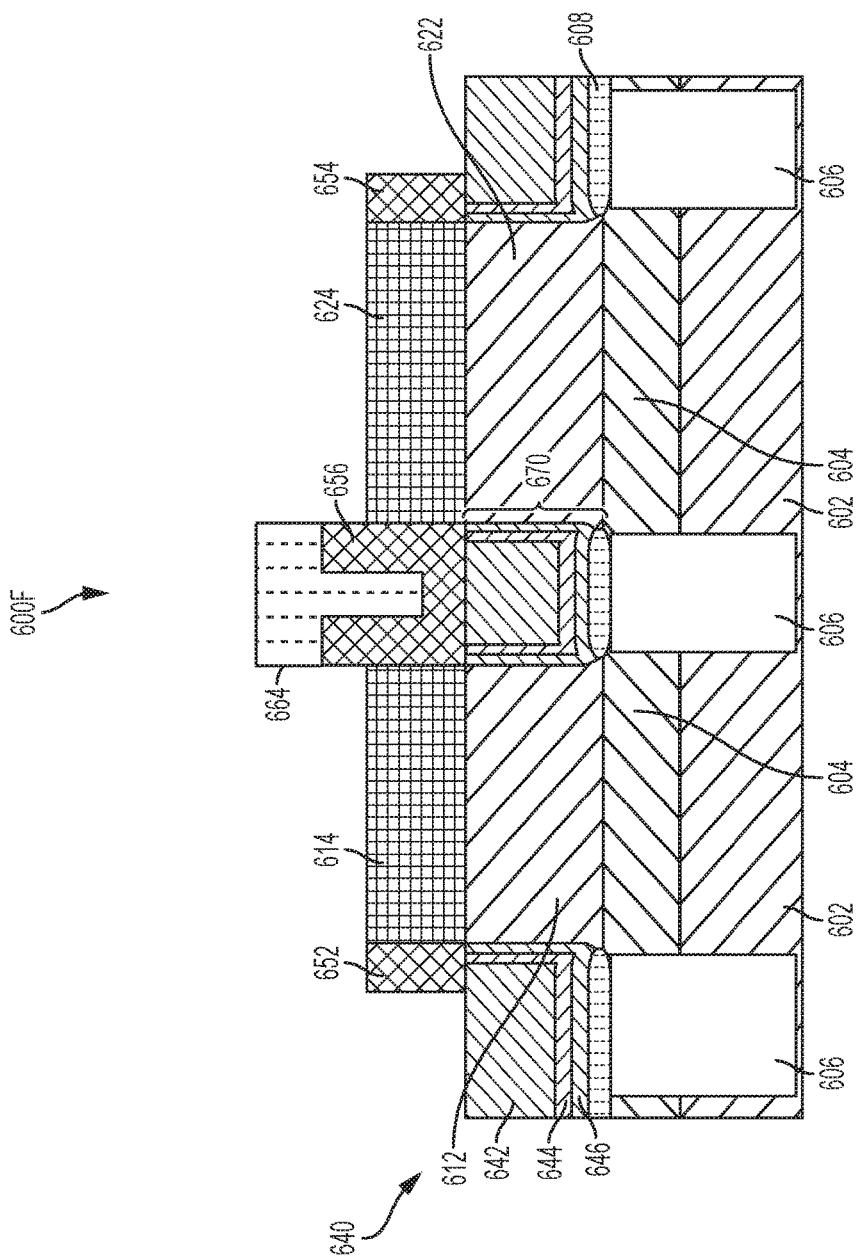
FIG. 11 depicts a cross-sectional view of a semiconductor structure after a fabrication stage according to one or more embodiments.
Figure 12B:
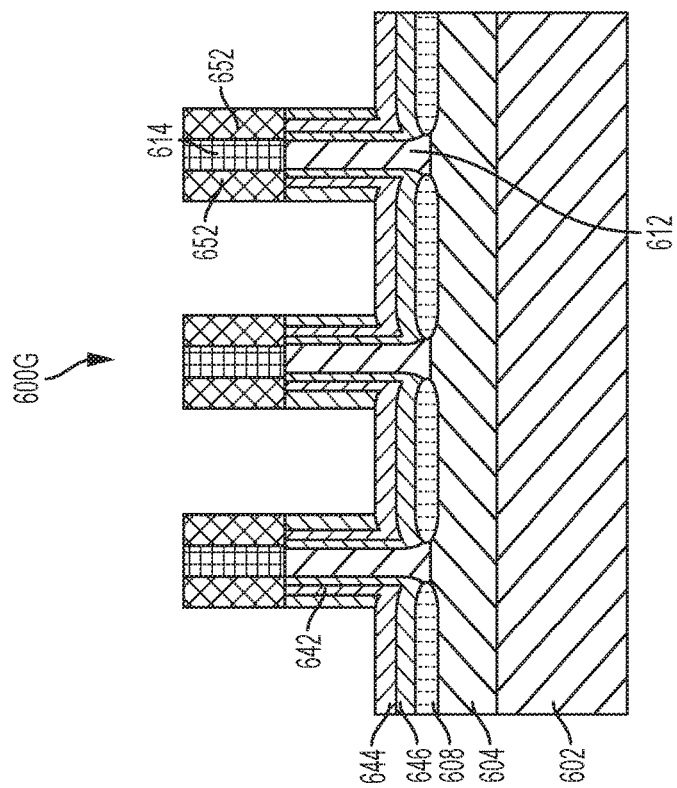
FIG. 12B depicts a cross-sectional view of a semiconductor structure after a fabrication stage according to one or more embodiments, wherein the view shown in FIG. 12B has been rotated 90 degrees counterclockwise from the view shown in FIG. 12A.
Figure 12A:
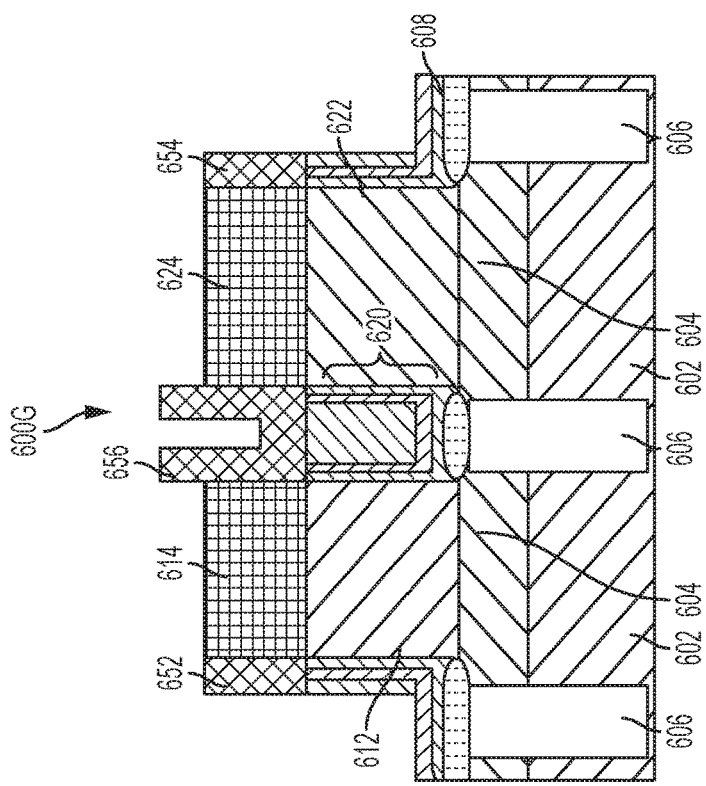
FIG. 12A depicts a cross-sectional view of a semiconductor structure after a fabrication stage according to one or more embodiments.
Figure 13:
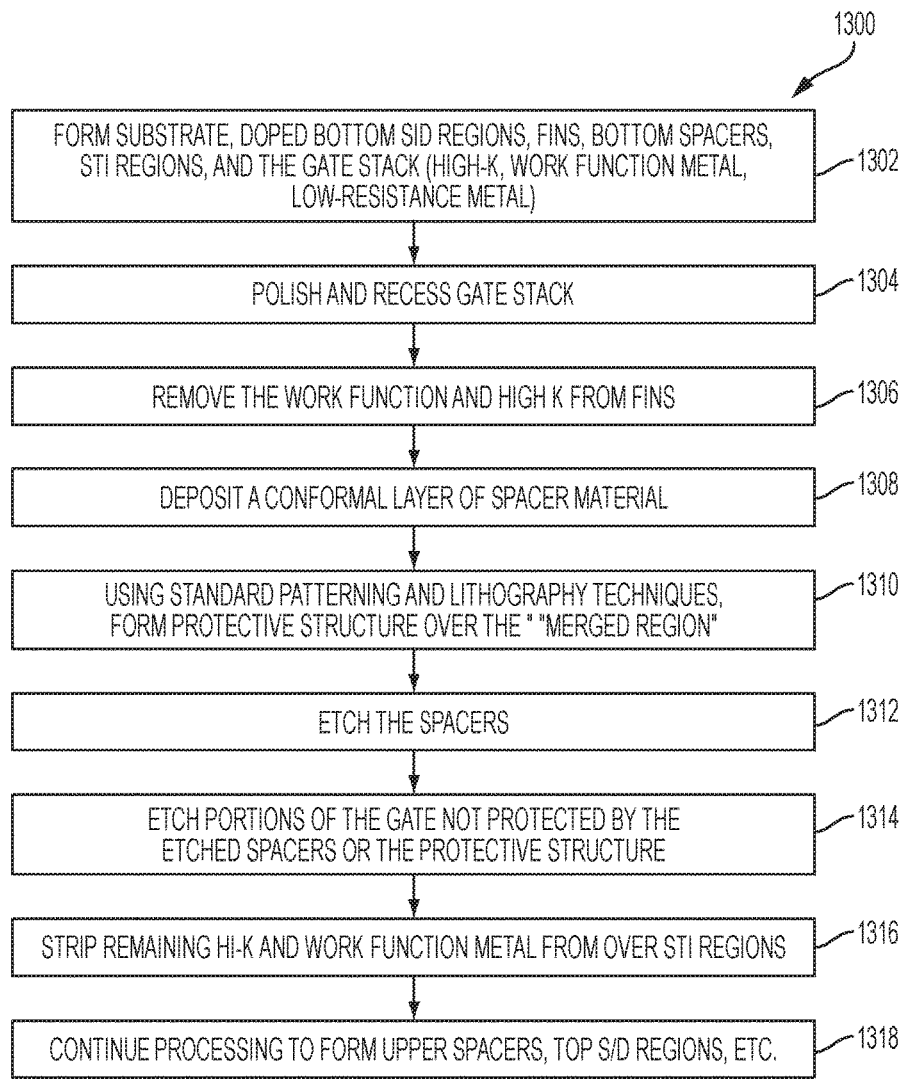
FIG. 13 depicts a flow diagram illustrating a via fabrication methodology according to one or more embodiments.

Another method of fabricating structure 200A according to one or more embodiments of the present invention will now be descried with reference to FIGS. 6A-12B and 13. More specifically, FIGS. 6A, 7A, 8A, 9A, 10A, 11 and 12A depict cross-sectional views of a semiconductor structure after a fabrication stage according to one or more embodiments. FIGS. 6B, 7B, 8B, 9B, 10B and 12B depict cross-sectional views of a semiconductor structure after a fabrication stage according to one or more embodiments, wherein the view shown in FIGS. 6B, 7B, 8B, 9B, 10B and 12B have been rotated 90 degrees counterclockwise from the corresponding view shown in FIGS. 6A, 7A, 8A, 9A, 10A and 12A. FIG. 13 depicts a flow diagram illustrating a methodology 1300 according to one or more embodiments. A description of SIT/merged gate fabrication methodologies according to one or more embodiment of the present invention will now be provided with reference to the gate fabrication stages shown in FIGS. 6A-12B, as well as methodology 1300 shown in FIG. 13.

FIG. 6A depicts a cross-sectional view of a semiconductor structure 600A after a fabrication stage according to one or more embodiments. FIG. 6B depicts a cross-sectional view of semiconductor structure 600A, wherein the view shown in FIG. 6B has been rotated 90 degrees counterclockwise from the view shown in FIG. 6A. As shown, semiconductor structure 600A includes a substrate 602, source/drain (S/D) regions 604, shallow trench isolation (STI) regions 606 to isolate separate devices, bottom spacers 608, fin structures formed from fins 612, 622 and hardmasks 614, 624, and a gate stack 640, configured and arranged as shown (block 1302). Gate stack 640 includes a low-resistance metal 642 over a work function metal (WFM) 644 and a high-k layer 646.

Figure 10A:
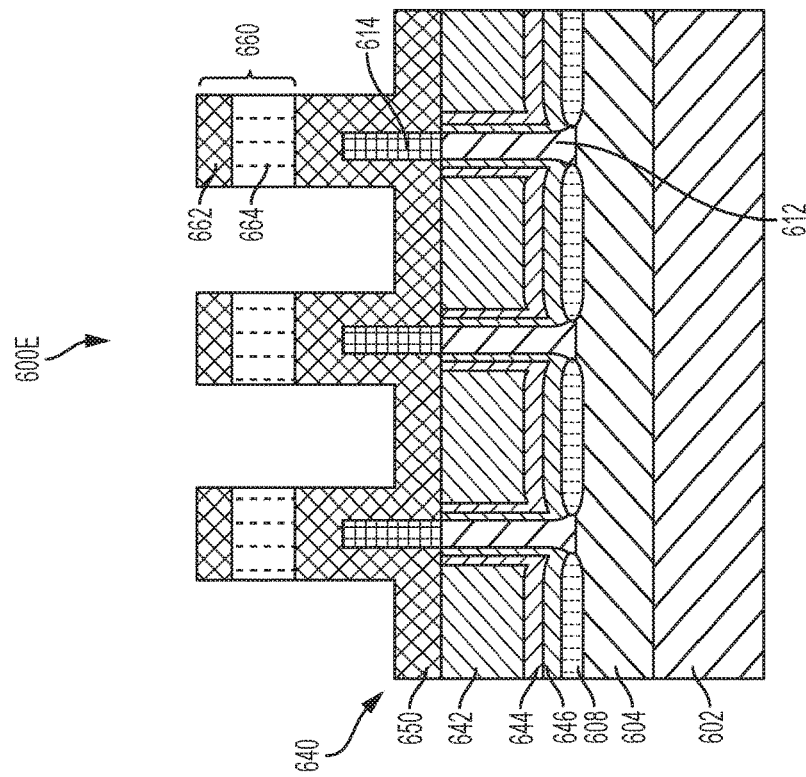
FIG. 10A depicts a cross-sectional view of a semiconductor structure after a fabrication stage according to one or more embodiments.
Figure 10B:
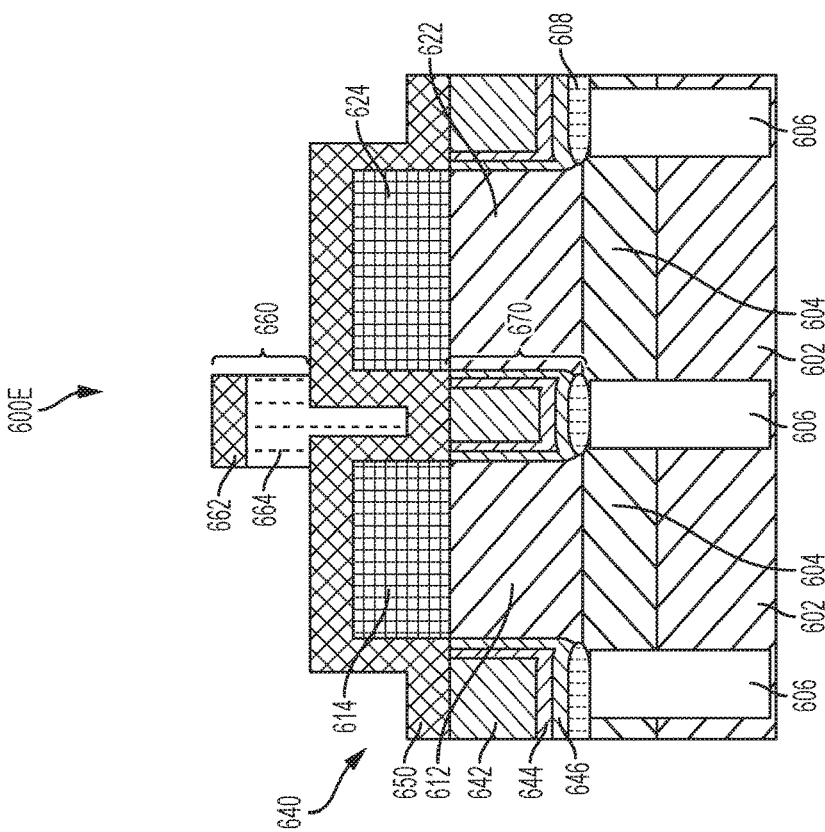
FIG. 10B depicts a cross-sectional view of a semiconductor structure after a fabrication stage according to one or more embodiments, wherein the view shown in FIG. 10B has been rotated 90 degrees counterclockwise from the view shown in FIG. 10A.

In FIG. 7A and FIG. 7B, as shown by structure 600B, gate stack 640 is polished and recessed (block 1304). In FIG. 8A and FIG. 8B, as shown by structure 600C, the WFM 644 and high-k layer 646 are removed from exposed portions of the fin structures (fin 612 and cap 614) (block 1306). In FIGS. 9A and 9B, as shown by structure 600D, a conformal layer of spacer material 650 is deposited over gate stack 640, and the fin structures 612, 614, 622, 624 (including the sidewalls of the fin structures) (block 1308). In FIGS. 10A and 10B, as shown by structure 600E, standard patterning and lithography techniques are used to form a protective structure 660 over a selected portion of spacer material 650 (block 1310). In one or more embodiments, protective structure 660 includes an ARC (anti-reflective coating) layer 662 and an organic planarization layer 660. As best shown in FIG. 10A, the portion of gate stack 640 that is under protective structure 660 is a merged gate region 670, which protective structure 660 and portions of spacer material 650 will protect during subsequent spacer and gate etch operations described in greater detail herein below. The protective structure 660 ensures that the merged gate region 670 is not etched away during the gate etch operations. Without the described protective structure 660, the SIT gate etch operation (described below) would etch away the merged gate region 670, and the adjacent thin high aspect ratio gate regions would not be merged. A top surface area of the protected merged gate region 670, which is defined by a surface area of the protective structure 660, includes sufficient area for making electrical contact to the resulting merged gate region 670.

In FIG. 11 and FIG. 12B, as shown by structures 600F and 600G, conformal layer of spacer material 650 (along with ARC layer 662) is etched to form a SIT spacer structure having a first spacer section 652, a second spacer section 654, and a merged spacer section 656 that joins first spacer section 652 and second spacer section 654 (block 1312). In one or more embodiments, a timed directional etch is applied to conformal layer of spacer material 650. Because conformal layer of spacer material 650 was conformally formed over the fin structures 612, 614, 622, 624 (including sidewalls thereof) and gate stack 640, and because the directional etch is applied for a certain time duration, the portions of conformal layer of spacer material 650 over the fin structures 612, 614, 622, 624 and gate stack 640 etch first, and the etch is stopped before the conformal layer of spacer material 650 on the sidewalls of the fin structures 612, 614, 622, 624 is etched. In addition, during the directional etch, protective structure 660 protects merged gate region 670. Accordingly, after the directional etch, the SIT spacer structure having first spacer section 652, second spacer section 654, and merged spacer section 656 is formed.

In FIG. 12A and FIG. 12B, as shown by structure 600G, the remaining portion (organic planarization layer 664) of protective structure 660 has been removed, and the gate stack 640 is etched (block 1314). At this stage, the portions of WFM 644 and high-k layer 646 formed over bottom spacers 608 are removed (block 1316), which results in the previously described structure 200A shown in FIGS. 2A and 2B. As previously noted herein, Semiconductor structure 200A has been fabricated up to the formation of its merged gate structure. Subsequent fabrication processes (e.g., formation of upper spacer, top source/drain regions, gate contacts, etc.) are applied to structure 200A to form a finished semiconductor device, which, according to one or more embodiments, is a vertical FET device (block 1318). The details of suitable subsequent fabrication processes to form a finished semiconductor device, including specifically forming a finished vertical FET, are known to those skilled in the art so have been omitted in the interest of brevity.

Thus, it can be seen from the foregoing detailed description and accompanying illustrations that one or more embodiments of the present invention provide improved fabrication methodologies and resulting structures for vertical FETs that include relatively high aspect ratio structures, are self-aligned, have merged gates and include sufficient area for placement of a merged gate contact. According to one or more embodiments, a self-aligned sidewall image transfer (SIT) technique is used to form the parallel gate of a vertical FET, thereby mitigating overlay errors and providing thin, high aspect ratio gates for maximum device density on the wafer. The described SIT technique is also used to form adjacent gate structures that are merged.

According to one or more embodiments, during an initial SIT fabrication operation, a relatively thick merged gate structure is formed. The initial merged gate structure includes adjacent gate structures joined by a merged gate region. The initial gate structure is etched to reduce the initial gate structure to the desired gate thickness. However, because the post-etch adjacent gates will be thin high aspect ratio structures, the SIT etch process that forms the thin gate structures has the potential to also etch the merged gate region that joins the adjacent gate structures. In order to ensure that initial merged gate region remains intact during gate fabrication (i.e., during the gate etch), a protective structure is formed over the merged gate region prior to the SIT gate etch operation. The protective structure ensures that the merged gate region is not etched away during the gate etch operation. Without the described protective structure, which is taught by the present invention, the SIT gate etch operation would etch away the merged gate region, and the adjacent thin high aspect ratio gate regions would not be merged. The footprint of the protective structure on the wafer defines the footprint of the merged gate region. The footprint of the protective structure is chosen to ensure that the footprint of the merged gate region includes sufficient area for making electrical contact to the resulting merged gate region.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The present invention has been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about" or "substantially" are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A semiconductor structure comprising:
   a first fin structure having a first sidewall;
   a first gate structure adjacent to a lower portion of the first sidewall;
   a first spacer structure over the first gate structure and adjacent to an upper portion of first the sidewall;
   wherein the first spacer structure includes a first spacer structure thickness dimension that extends in a first direction away from the first sidewall;
   wherein the first gate structure includes a first gate structure thickness dimension that extends in the first direction away from the first sidewall; and
   wherein the first gate structure thickness dimension is about equal to the first spacer structure thickness dimension.

2. The structure of claim 1 further comprising:
   a second fin structure having a second sidewall; and
   a second gate structure having a merged gate region that couples the first gate structure and the second gate structure.

3. The structure of claim 2, wherein the second gate structure is adjacent to a lower portion of the second sidewall.

4. The structure of claim 3 further comprising a second spacer structure having a merged spacer structure region that couples the first spacer structure and the second spacer structure.

5. The structure of claim 4, wherein the second spacer structure is over the second gate structure and adjacent to an upper portion of second the sidewall.

6. The structure of claim 5, wherein the second spacer structure includes a second spacer structure thickness dimension that extends in the first direction away from the second sidewall.

7. The structure of claim 6, wherein the second gate structure includes a second gate structure thickness dimension that extends in the first direction away from the second sidewall.

8. The structure of claim 7, wherein the second gate structure thickness dimension is about equal to the second spacer structure thickness dimension.

9. The structure of claim 8, wherein the merged spacer structure region is over the merged gate region.

10. The structure of claim 8, wherein the first fin structure comprises:
    a first fin; and
    a first hardmask over a top surface of the first fin.

11. The structure of claim 10, wherein the second fin structure comprises:
    a second fin; and
    a second hardmask over a top surface of the second fin.

12. A semiconductor structure comprising:
    a first fin structure having a first sidewall;
    a first gate structure adjacent to a lower portion of the first sidewall;
    a second fin structure having a second sidewall;
    a first spacer structure over the first gate structure and adjacent to an upper portion of the first sidewall; and
    a second gate structure having a merged gate region that couples the first gate structure and the second gate structure;
    wherein the first spacer structure includes a first spacer structure thickness dimension that extends in a first direction away from the first sidewall;
    wherein the first gate structure includes a first gate structure thickness dimension that extends in the first direction away from the first sidewall;
    wherein the first gate structure thickness dimension is about equal to the first spacer structure thickness dimension;
    wherein a top surface of the merged gate region is below a top surface of the first fin structure and a top surface of the second fin structure.

13. The structure of claim 12, wherein the second gate structure is adjacent to a lower portion of the second sidewall.

14. The structure of claim 13 further comprising a second spacer structure having a merged spacer structure region that couples the first spacer structure and the second spacer structure.

15. The structure of claim 14, wherein the second spacer structure is over the second gate structure and adjacent to an upper portion of second the sidewall.

16. The structure of claim 15, wherein the second spacer structure includes a second spacer structure thickness dimension that extends in the first direction away from the second sidewall.

17. The structure of claim 16, wherein the second gate structure includes a second gate structure thickness dimension that extends in the first direction away from the second sidewall.

18. The structure of claim 17, wherein the second gate structure dimension is about equal to the second spacer structure thickness dimension.

19. The structure of claim 18, wherein:
the merged spacer structure region is over the merged gate region;
the first fin structure comprises a first fin and a first hardmask over a top surface of the first fin; and
the second fin structure comprises a second fin and a second hardmask over a top surface of the second fin.

* * * * *